United States Patent [19]
Farrow

[11] Patent Number: 4,866,647
[45] Date of Patent: Sep. 12, 1989

[54] CONTINUOUSLY VARIABLE DIGITAL DELAY CIRCUIT

[75] Inventor: Cecil W. Farrow, Highlands, N.J.

[73] Assignees: American Telephone and Telegraph Company, New York, N.Y.; AT&T Information Systems Inc., Morristown, N.J.

[21] Appl. No.: 152,281

[22] Filed: Feb. 4, 1988

[51] Int. Cl.[4] .......................................... G06F 15/353
[52] U.S. Cl. ................................................. 364/724.1
[58] Field of Search ............................ 364/723, 724.1

[56] References Cited

U.S. PATENT DOCUMENTS

| | | | |
|---|---|---|---|
| 3,092,808 | 6/1963 | Wychorski et al. | 340/146.2 |
| 3,480,767 | 11/1969 | Howe | 235/150.53 |
| 3,786,195 | 1/1974 | Schiffman | 179/15.55 |
| 4,020,332 | 4/1977 | Crochiere et al. | 364/724.1 |
| 4,064,379 | 12/1977 | Horna | 179/170.2 |
| 4,275,457 | 6/1981 | Leighou et al. | 364/900 |
| 4,281,318 | 7/1981 | Candy et al. | 340/347 |
| 4,356,559 | 10/1982 | Candy et al. | 364/724 |
| 4,460,890 | 7/1984 | Busby | 364/724.1 |
| 4,527,020 | 7/1985 | Ito | 179/170.2 |
| 4,748,578 | 5/1988 | Lagadec et al. | 364/724.1 |

OTHER PUBLICATIONS

Crochiere et al., "A Novel Implementation of Digital Phase Shifter", *The Bell System Tech. J.*, Oct. 1975, pp. 1497-1502.

*The Bell System Technical Journal*, vol. 62, No. 4, Apr. 1983, "A Circuit That Changes the Word Rate of Pulse Code Modulated Signals", Candy et al., pp. 1161-1168.

*IEEE*, 1987, "An All-Digital Timing Recovery Scheme for Voiceband Data Modems", A. Haouni et al., pp. 1911-1912.

*Int. J. Electronics*, 1970, vol. 29, No. 4, pp. 349-354, "Continuous Filters Using Digital Techniques etc. . . . ", A. G. J. Holt et al.

*Proc. of the IEEE*, vol. 61, No. 6, Jun. 1973, "A Digital Signal Processing Approach to Interpolation", R. W. Schafer et al., pp. 692-702.

*Funkschau*, 1980, Heft 16, "Ein digitales Echo-und Nachhallgerat fur Studioanwendeungen", D. Thomsen, pp. 77-80.

Primary Examiner—David H. Malzahn
Attorney, Agent, or Firm—Frederick B. Luludis

[57] ABSTRACT

The process of interpolating between two different sampling rates at any point in a sampling interval is obtained using a transversal filter arranged as a continuously variable digital delay line in which the tap coefficients of the delay line are made to be a function of the coefficients of an nth degree polynomial and the delay between the two sampling rates.

6 Claims, 4 Drawing Sheets

| | | | |
|---|---|---|---|
| $a_{0,0}$ -4624 | $a_{0,1}$ 0 | $a_{0,2}$ 18495 | |
| $a_{1,0}$ 37355 | $a_{1,1}$ -65536 | $a_{1,2}$ -18348 | |
| $a_{2,0}$ 37355 | $a_{2,1}$ 65536 | $a_{2,2}$ -18348 | |
| $a_{3,0}$ -4624 | $a_{3,1}$ 0 | $a_{3,2}$ 18495 | |

FIG. 6

| | | | |
|---|---|---|---|
| $a_{0,0}$ -272 | $a_{0,1}$ 58 | $a_{0,2}$ 1088 | $a_{0,3}$ -232 |
| $a_{1,0}$ 935 | $a_{1,1}$ -332 | $a_{1,2}$ -3740 | $a_{1,3}$ 1328 |
| $a_{2,0}$ -2651 | $a_{2,1}$ 1678 | $a_{2,2}$ 10604 | $a_{2,3}$ -6712 |
| $a_{3,0}$ 10112 | $a_{3,1}$ -20127 | $a_{3,2}$ -7680 | $a_{3,3}$ 14972 |
| $a_{4,0}$ 10112 | $a_{4,1}$ 20127 | $a_{4,2}$ -7680 | $a_{4,3}$ -14972 |
| $a_{5,0}$ -2651 | $a_{5,1}$ -1678 | $a_{5,2}$ 10604 | $a_{5,3}$ 6712 |
| $a_{6,0}$ 935 | $a_{6,1}$ 332 | $a_{6,2}$ -3740 | $a_{6,3}$ -1328 |
| $a_{7,0}$ -272 | $a_{7,1}$ -58 | $a_{7,2}$ 1088 | $a_{7,3}$ 232 |

CONTINUOUSLY VARIABLE DIGITAL DELAY CIRCUIT

FIELD OF THE INVENTION

The invention relates to data sets, such as a modem, and more particularly to a continuously variable digital delay line used as an interpolator in such data sets to convert a digital signal sample sampled at a first rate into a digital sample sampled at a second rate.

BACKGROUND OF THE INVENTION

In certain digital applications, digital samples of an analog signal which are transferred from a digital system operating under a first sampling clock rate to a digital system operating under a second clock rate requires a so-called interpolator arrangement to interpolate between the sample clock rates. One way of providing such interpolation is disclosed in U.S. Pat. No. 4,527,020 issued July 2, 1985, to Y. Ito. In the Ito arrangement, a digital filter, commonly referred to as a transversal filter, is used to perform the interpolation in which the sampling interval of a first sampling clock signal (CK2) is divided into a plurality of segments each associated with a respective group of filter tap coefficients. Each digital sample to be interpolated at each occurrence of a second sampling clock signal (CK1) is obtained by supplying to the digital filter the group of tap coefficients associated with that segment of the interval which is present at the time of the second sampling clock signal.

The precision of the ITO interpolation arrangement may be improved by dividing the interval of the first sampling clock into a large number of segments. However, doing so requires the arrangement to store in memory a like number of different groups of tap coefficients. The storage of a large number of different tap coefficients becomes unwieldy, especially if the digital filter is a multi-tap transversal filter.

SUMMARY OF THE INVENTION

In prior art interpolators used to interpolate between different sampling rates, the interpolated sample is generated using one of a plurality of different groups of filter tap coefficients. In accordance with the invention, by contrast, I have discovered that a transversal filter arranged as a continuously digital delay line may be used to interpolate between different sampling rates at any point in the timing interval in which the coefficients of the filter taps are generated as a function of the coefficients of an nth degree polynomial and the delay between the two clock rates. Thus, the coefficients of the delay line required for precise interpolation of signal samples at a particular point in the timing interval are generated for that point. The invention is, therefore, advantageous since there is no need to store in memory an inordinate number of different groups of coefficients to achieve precision in the interpolation process.

DETAILED DESCRIPTION

The basic structure of a finite impulse response filter typically consists of a chain of delay stages (for example, register circuits) for storing digital samples of a signal and at least one multiplier circuit. The digital samples contained in the delay stages are multiplied by respective coefficients and the results are summed together to generate a digitally filtered version of the stored samples. When the summation is completed, each sample is shifted down the chain by one position to the next delay stage, thereby preparing the first delay stage to receive the latest digital sample of the signal. Each digital sample thus propagates through each stage of the filter. The impulse response of such a filter may be mathematically stated as follows:

$$y(t) = \sum_{n=0}^{n=N-1} a_n x_n(t) \quad (1)$$

where N is equal to the number of filter taps.

Equation (1) is also commonly referred to as being the impulse response of a so-called transversal filter, in which the signal elements $x_n(t)$ are available at respective taps of the transversal filter and in which the elements $a_n$ are the values of the respective tap coefficients.

In the input to the filter is a signal which is a function of time, f(t), and the filter is a delay line, then the signal outputted by the filter is a signal which is a function of both time and delay, i.e., $f(t-\tau)$, where $\tau$ is equal to the delay. The output of such a delay line may be generally expressed mathematically as follows:

$$y(t) = \sum_{n=0}^{n=N-1} p_n(\tau) x(t) \quad (2)$$

With the above in mind, I have recognized that the concepts of transversal filters and delay lines could be advantageously extended to a delay line having a variable delay $\tau$ and tap coefficients which are a function of the delay, i.e., $p_n(\tau)$ in which the values of one such coefficient $p_n$ for various values of $\tau$ when fitted to an nth degree polynomial would be, in accordance with the invention, a function of the delay and respective coefficients of the polynomial. Thus, unlike the prior arrangement discussed above which is limited to selecting one of a number of different groups of tap coefficients, my arrangement generates the coefficients of the delay line at any point in the timing interval based on the value of the delay itself.

In particular, the tap coefficients $p_n(\tau)$ shown in equation (2) when fitted to an nth degree polynomial may be mathematically stated as follows:

$$P_n(\tau) = a_{n,0} + a_{n,1}\tau + a_{n,2}\tau^2 + \ldots a_{n,m}\tau^m \quad (3)$$

where $a_{n,m}$ is a respective coefficient of the polynomial. Applying equation (3) to equation (2) for a matrix of polynomial coefficients ranging from $a_{0,0}$ to $a_{2n-1,m}$ yields the following mathematical expression:

$$y(t) = (a_{0,0} + a_{0,1}\tau + a_{0,2}\tau^2 + \ldots a_{0,m}\tau^m)x_0(t) + \quad (4)$$
$$(a_{1,0} + a_{1,1}\tau + a_{1,2}\tau^2 + \ldots a_{i,m}\tau^m)x_1(t) +$$
$$(a_{2,0} + a_{2,1}\tau + a_{2,2}\tau^2 + \ldots a_{2,m}\tau^m)x_2(t) + \ldots$$

in which the terms enclosed by the parentheses are the coefficients of the delay line, which in accordance with the invention, are generated as a function of the delay. Equation (4) is mathematically equal to the following expression:

$$y(t) = (a_{0,0}x_0(t) + a_{1,0}x_1(t) + \ldots a_{n,0}x_n(t)) + \quad (5)$$
$$(a_{0,1}x_0(t) + a_{1,1}x_1(t) + \ldots a_{n,1}x_n(t))\tau +$$
$$(a_{0,2}x_0(t) + a_{1,2}x_1(t) + \ldots a_{n,2}x_1(t))\tau^2 + \ldots$$

Equation (5) may be factored to yield a more practical mathematical expression of the signal that is outputted by my invention as follows:

$$y(t) = \sum_{n=0}^{n=N-1} a_{n,0} \cdot x_n + \tau \cdot \left( \sum_{n=0}^{n=N-1} a_{n,1} \cdot x_n + \quad (6) \right.$$
$$\tau \cdot \left( \sum_{n=0}^{n=N-1} a_{n,2} \cdot x_n + \ldots + \right.$$
$$\left. \left. \tau \cdot \left( \sum_{n=0}^{n=N-1} a_{n,m} \cdot x_n + \right) \ldots \right) \right)$$

Figure 1:
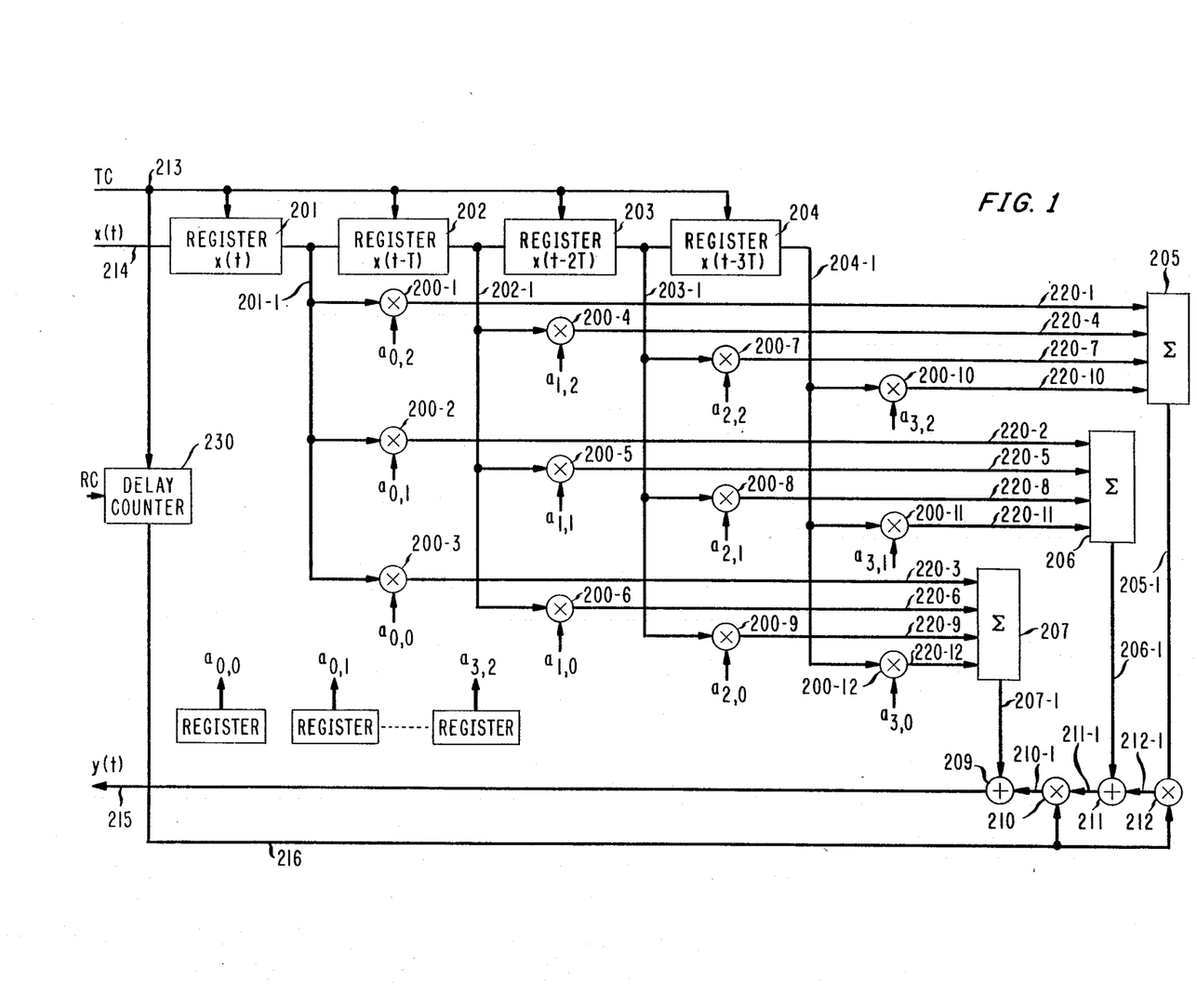
FIG. 1 is a block diagram of a second-order transversal filter in which the present invention is illustratively implemented.

Turning now to FIG. 1, there is shown an illustrative example of a second-order transversal filter arranged in accordance with the invention, i.e., as a continuously variable digital delay (CVDD) line whose coefficients are a function of the digital value of the delay supplied via multibit bus 216. The continuously variable digital delay line illustrated in FIG. 1 includes multibit delay stages, or registers, 201 through 204 for storing a sequence of digital samples x(t) through x(t−3T) of the signal being processed, the signal being, for example, a signal received from a far-end modem and which is sampled at a rate of 1/T. The latest of such samples, x(t), is stored in register 201, the next to the latest, x(t−T), is stored in register 202, and so on. A clock signal, for example, the transmit clock signal (TC) generated by a modem clock circuit, or the clock signal CK1 disclosed in the aforementioned Ito patent, received via lead 213 causes the contents of each register to be shifted from left to right to the next register, thereby preparing register 201 for receipt of the next digital sample.

When digital sample x(t) is received from an external sampling circuit, or input buffer, as the case may be, via bus 214, it is stored in register 201 and supplied to multiplier circuits 200-1 through 200-3 via bus 201-1. Similarly, the digital sample, x(t−T) stored in register 202 is supplied to multiplier circuits 200-4 through 200-6 via bus 202-1, the digital sample, x(t−2T) stored in register 203 is supplied to multiplier circuits 200-7 through 200-9 via bus 203-1 and the digital sample, x(t−3T), stored in register 204 is supplied to multiplier circuits 200-10 through 200-12 via bus 204-1. The multipliers 200-1 through 200-12 each multiply the digital sample it receives with a respective one of polynomial coefficients $a_{0,0}$ through $a_{3,2}$ and supplies a signal representative of the product of the multiplication to a respective summation circuit 205 through 207 via a respective one of busses 220-1 through 220-12. It is to be understood by the art that polynomial coefficients $a_{0,0}$ through $a_{3,2}$ represent their actual values or magnitudes which are stored in respective multibit registers whose outputs are connected to respective ones of multipliers 200-1 through 200-12, as shown in FIG. 1. (The derivation of the actual values of coefficients $a_{0,0}$ through $a_{3,2}$ will be discussed below).

Summation circuits 205 through 207 each sum the digital signals they receive and output digital signals representative of their respective summations to one of the circuits 209, 211 and 212, respectively. Multiplier circuit 212 is arranged to multiply the summation it receives from circuit 205 via bus 205-1 with the digital value of the delay received via bus 216 and to supply the product thereof to adder circuit 211 via bus 212-1. Adder circuit 211 adds the digital value that it receives from multiplier 212 with the summation that it receives from summation circuit 206 via bus 206-1 and supplies the sum to multiplier circuit 210 via bus 211-1. Multiplier circuit 210 is arranged to multiply the sum it receives from adder 211 and the value of the delay received delay counter 230 via bus 216. (The manner in which the value of the delay is generated by delay counter 230 will be discussed below). Mulipler circuit 210 supplies to adder circuit 209 via bus 210-1 the final product involving the value of the delay. Adder circuit 209 adds the value of the product received from multiplier 210 to the value of the summation that it receives from summation circuit 207 via bus 207-1 and outputs a digital signal representative of that sum to bus 215, the digital signal being a sample which has been interpolated in accordance with the invention.

It is noted that bus 214 could be connected to an input buffer (not shown) which is used to store the samples of a signal received from, for example, a far-end modem. The signal samples may then be clocked one at a time to the input of register 201 using the TC clock signal. In addition, the interpolated sample y(t) outputted by adder 209 could be stored in an output buffer (not shown) connected to bus 215.

As mentioned above, delay counter 230 shown in FIG. 1 is used to determine the delay, if any, between the sampling rates of clock signals TC and RC. In the case of the aforementioned Ito patent, clock signals TC and RC would be the CK1 and CK2 clock signals, respectively. In the case of a modem. clock signal TC would be the transmit clock signal and clock signal RC would be the receive clock signal. Specifically, delay counter 230 comprises a counter for counting the rate of the TC clock signal and a counter for counting the rate of the RC clock signal. The difference between the contents of each counter is determined each time that the counter counting the rate of the TC clock signal passes through zero. This difference is then used to generate the value of the delay between the rates of the two clock signals. The delay, as determined by counter 230, is then outputted to bus 216.

It is to be understood of course that the value of the delay supplied via bus 216 could also be a fixed value contained in a register the output of which is supplied to bus 216. The register could also be under program control which periodically changes the contents of the register responsive to a particular algorithm.

Figure 2:
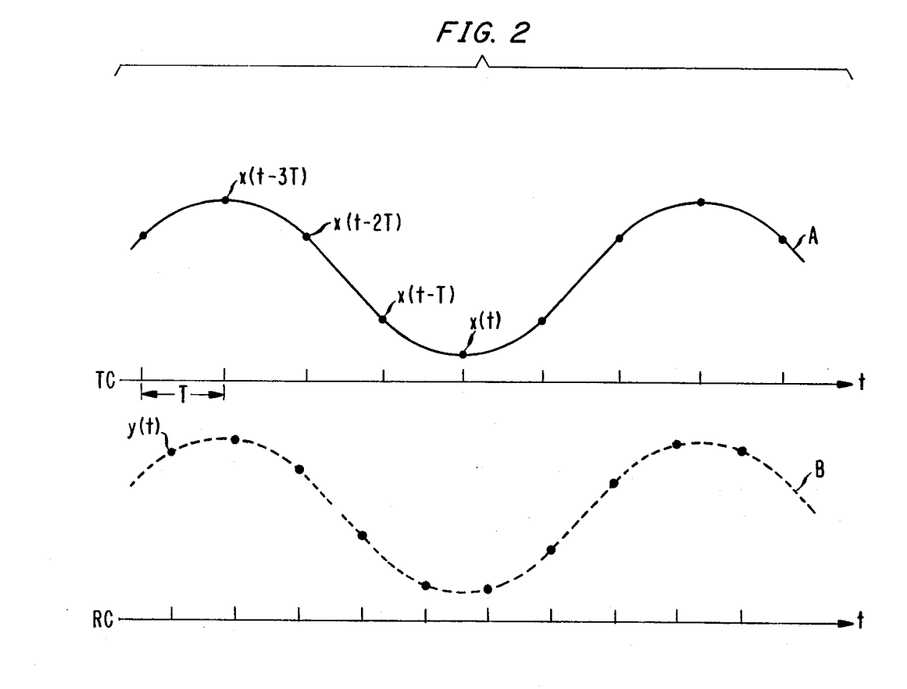
FIG. 2 illustrates a signal sampled at a first clock rate in which the samples are interpolated with respect to a second clock rate.

Turning now to FIG. 2, there is shown an illustrative example of a signal "A" received from, for example, a modem, in which the signal "A" is digitally sampled at the rate of the TC clock (i.e., 1/T) to provide signal samples, such as, for example, samples x(t) through x(t−3T). When those samples are supplied to a CVDD arranged in accordance with the invention an interpolated sample y(t) in step with a respective pulse of the RC clock is generated therefrom. It is seen from FIG. 2 that when a dashed line is drawn passing through each of the interpolated samples, the resulting signal "B" is virtually identical to signal "A".

The precision of interpolating the samples of a signal, such as the samples of signal "A" shown in FIG. 2 using a CVDD filter circuit arranged in accordance with the invention is commensurate with the degree of the filter. Thus, the interpolation process performed by a third-order transversal filter arranged in accordance with the invention is more precise than that performed by the second-order transversal filter shown in FIG. 1. Accordingly, in a preferred embodiment of the invention, an 8-tap, third-order CVDD transversal filter operating over a frequency band from 0 to 3150 Hz was designed to achieve precision in the interpolation process. Since the number of multiplier circuits required to implement such a filter would be unwieldy, the filter was implemented on a digital signal processor (DSP), such as, for example, the digital signal processor designated DSP-20, which is available from AT&T. The DSP-20 is disclosed in THE BELL SYSTEM TECHNICAL JOURNAL, September 1981, Vol. 60, No. 7, Part 2, pp. 1431–1462, which is hereby incorporated by reference.

Briefly, in the DSP embodiment of my invention, the eight stages of the delay line are implemented using eight memory locations of the DSP's random access memory (RAM). The latest digital sample and the seven most recent digital samples are stored in the eight memory location, respectively. A block of RAM is also used to store the predetermined magnitudes of the polynomial coefficients for an eight-tap delay line, the coefficients being $a_{0,0}$ through $a_{7,3}$, as will be shown below. A program contained in the DSP's read only memory generates the interpolated value using (a) the digital samples stored in the eight RAM locations, (b) the values of the coefficients, and (c) the value of the delay. The manner in which the DSP interpolates signal samples is similar to the discussed above in connection with FIG. 1. It is noted that the value of the delay between clock rates may determined using the delay counter 230 shown in FIG. 1. The generated value of the delay is then supplied to the DSP for use in generating the interpolated signal sample, in accordance with the invention.

After the interpolated value has been generated and outputted to, for example, an output buffer, a program stored in the DSP's ROM effectively shifts the stored digital samples to the right to prepare the first of the eight RAM locations for the storage of the next inputted digital sample, i.e., the latest digital sample.

We now turn to a discussion of the software programs which implement the invention on a DSP.

Figure 3:
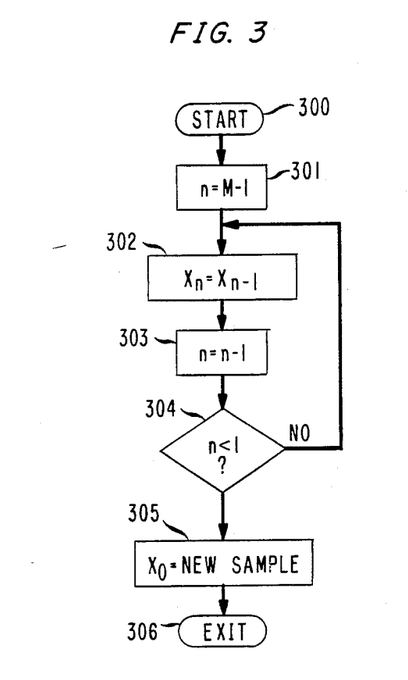
FIGS. 3 and 4 illustrate software flow charts depicting the operation of the present invention when implemented on, for example, a digital signal processor.

Turning them to FIG. 3, there is shown a flow chart of the DSP program which shifts the inputted signal samples stored in respective memory registers to the right in the manner discussed above in connection with registers 201 through 204 of FIG. 1 to prepare the first of such memory registers for receipt of the next digital sample. As noted above, in my DSP implementation, eight raps are used thereby requiring eight delay stages, or register. Thus, the program shown in FIG. 3 causes each stored digital sample to be shifted right to the next or succeeding memory register. It is to be understood of course that the program shown in FIG. 3 is not tied to a delay line having eight taps and may be used with a continuously variable digital delay line having virtually any number of taps (registers).

Specifically, when the program illustrated in FIG. 3 is entered at block 300 it proceeds to block 301 where it sets the variable n to be equal to one less than the number of taps (M) in the delay line, in which in the preferred embodiment of the invention would be the number eight. (It is noted that the value of M for the delay line illustrated in FIG. 1 would be 4). The program then proceeds to block 302 where it begins the process of shifting digital samples from one memory register to the next succeeding member register, beginning with shifting the digital sample from the seventh memory register to the eighth memory register. When that shift is completed the program then proceeds to block 303 where it decrements the variable n by one and then proceeds to block 304. At block 304, the program tests the value of n to determine if it has completed the shifting of the digital samples in the manner discussed above. The program makes this determination by comparing the value of n with the number one. If n is less than one, then the program concludes that it has completed the task of shifting the digital samples and proceeds to block 305. Otherwise, the program returns to block 302 to perform the next shift.

At block 305, the program loads the latest digital sample received by the DSP into the first location of the sample memory registers and then exists via block 306.

Figure 4:
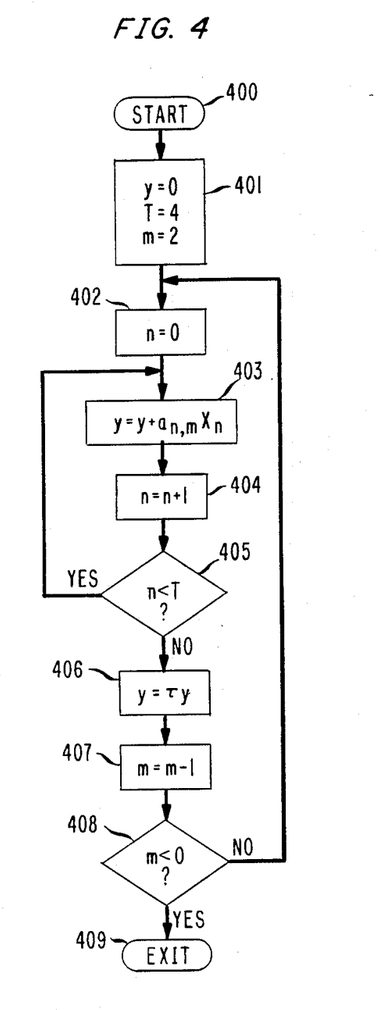

Turning now to FIG. 4, there is shown a flow chart of the DSP program which generates the interpolated signal sample from the signal samples currently stored in the sample memory registers. In the interest of clarity, the following discussion will be directed to a second-order delay line so that the flow of the program may follow the flow of the digital samples in the second-order delay line illustrated in FIG. 1.

Specifically, the program illustrated in FIG. 4 may be invoked either prior to or after the program illustrated in FIG. 3. When invoked at block 400, the program proceeds to block 401 where it clears a register designated y which is used to accumulate the results of various operations performed by the program. The y register at the completion of the program will then contain the digital value of the interpolated signal sample. The program also sets the variable m to equal two to handle the second-order case and sets the constant T to the number of stages in the filter, which for the circuit shown in FIG. 1 is four. The program then proceeds to block 402. (It is noted that for the aforementioned 8-tap third-order delay line the variable m would be set to three and the constant T would be set to 8).

At block 402, the program sets the variable n to equal zero and proceeds to block 402. It is noted that blocks 403 through 405 comprise a looping routine which performs the function performed by each group of multipliers and their associated summation circuit based on the values of variables n and m, such as the group of multipliers 200-1, 200-4, 200-7 and 200-10 and summation circuit 205 shown in FIG. 1 when the values of n and m or 0 and 2, respectively. In particular, during the first pass through the loop, the product of the latest signal sample and delay line coefficient $a_{0,2}$ is added to the contents of the y register, the y register being analogous to accumulation circuit 205. The variable n is then incremented by one at block 404 and compared with the constant T at block 405. If the value of n is less than T, i.e, less than four, as would be the case after the first pass through the loop, then the program returns to block 403. Otherwise, it proceeds to block 406. During the second pass through block 403, the program adds the product of the next-to-the-latest signal sample and coefficient $a_{1,2}$ to the contents of register y. This process is repeated for coefficients $a_{2,2}$ and $a_{2,3}$ and the remaining signal samples. When the last signal sample has been processed, for example, the sample contained in register 204 of FIG. 1, the variable n is once again incremented by one at block 404, thereby making it at least equal to the value of T and causing the program to proceed to block 406.

At block 406 the program multiplies the contents of the y register with the current value of the delay $\tau$ and proceeds to block 407. At block 407, the program decrements the variable m by one and then proceeds to block 408 where it tests the value of m to determine if it is less than zero. If the value of m is not less than zero, then the program transfers to block 402 to perform the function performed by the next group of multipliers and their associated summation circuit, i.e, multipliers 200-2, 200-5, 200-8 and 200-11 and summation circuit 206. When the program completes that task, it once again proceeds block 407 via block 406 to decrement the variable m and then proceed to block 408. At this point, the program would find that the value of m is still not less than zero and, therefore, would proceed to block 402, where it would perform the function performed by multipliers 200-3, 200-6, 200-9 and 200-9 and summation circuit 207, as directed by the values of variables m and n. After performing that function, the program would then proceed to block 407 via block 406 and would once again decrement the variable m and then proceed to block 408. At this point, however, the program would find that the value m is less than zero, thereby causing the program to output the digital value contained in the y register, the digital value being, in accordance with the invention, the interpolated signal sample. The program then exits via block 409 after completing that task.

We turn now to discussion of generating the nth degree polynomial coefficients, discussed above, and shown in FIG. 1 as $a_{0,0}$ through $a_{3,2}$.

Specifically, the transfer function of a filter with a flat delay $\tau$ may be stated mathematically as follows:

$$G(\omega,\tau) = e^{jn\omega T} \quad (7)$$

The transfer function of a transversal filter with coefficients ... $C_k$ ... and sampling interval T may be stated as follows:

$$G(\omega) = \sum_{n=0}^{n=N-1} C_n e^{jn\omega T} \quad (8)$$

where N is equal to the number of taps of the transversal filter (CVDD).

Using a delay parameter $\alpha$ such that $\tau = \alpha T$ and tap coefficients which are polynomials in $\alpha$ then:

$$G(\omega,\alpha) = \sum_{n=0}^{n=N-1} C_n(\alpha) e^{jn\omega T} =$$ (9)

-continued $$\sum_{n=0}^{n=N-1} \sum_{m=0}^{M} \alpha^m C_{n,m} e^{jn\omega T} = e^{j\omega(\alpha T)}$$

where M is equal to the degree of the polynomial.

To determine the coefficients for a CVDD, the following expression (10) derived from equation (9) is then minimized using the method of least squares with respect to the matrix [C]:

$$\int_{\omega_0}^{\omega_1} \int_{\alpha_0}^{\alpha_1} \left| \sum_n \sum_m \alpha^m C_{n,m} e^{jn\omega T} - e^{j\omega(\alpha T)} \right|^2 d\alpha d\omega \quad (10)$$

Using a CVDD of length N, where N is even, expression (10) is then subjected to the following constraints to determine the values of the respective coefficients of the polynomial:

$$C_n(\tfrac{1}{2}) = 0; n \neq (N-1)/2 \quad (11)$$
$$= 1; n = (N-1)/2$$

$$C_n(-\tfrac{1}{2}) = 0; n \neq N/2$$
$$= 1; n = N/2$$

Figure 5:
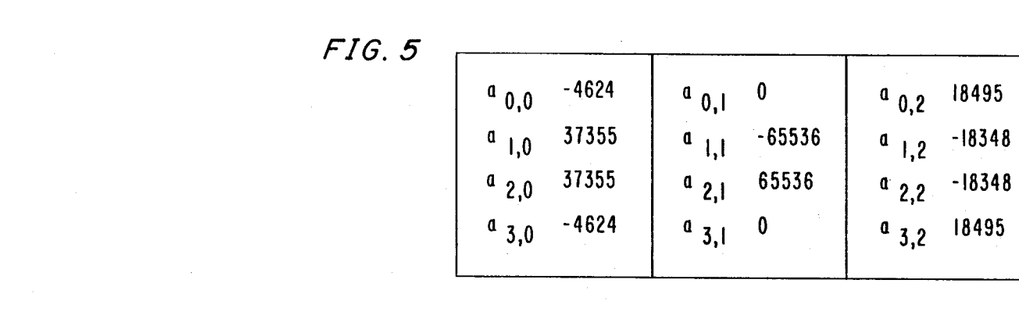
FIGS. 5 and 6 each illustrate a matrix of predetermined polynomial coefficients for use in a second-order and third-order transversal filter, respectively, implemented in accordance with invention.
Figure 6:
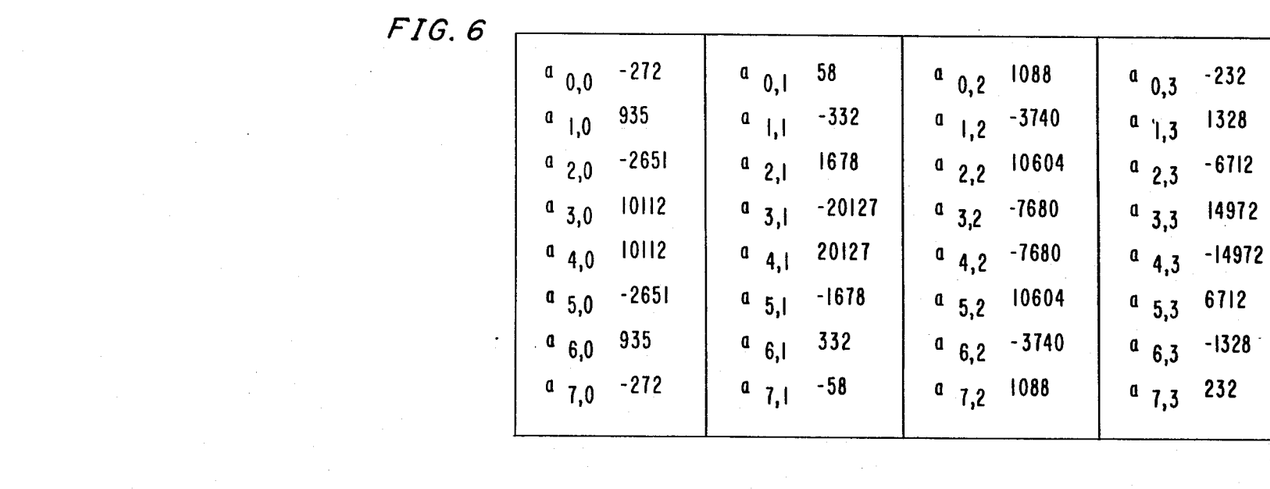

Employing expression (10) and the constraints imposed by (11), the polynomial coefficients $a_{o,o}$ through $a_{3,2}$ for a second-order four-tap transversal filter (CVDD) having a cut-off frequency of 1350 Hz and an interval T equal to 1/9600 Hz were determined as shown in FIG. 5. The polynomial coefficients for a third-order 8-tap transversal filter having cut-off frequency of 3000 Hz and an interval T equal to 1/9600 Hz were also determined and are shown in FIG. 6.

The foregoing is merely illustrative of the principles of the invention. Those skilled in the art will be able to devise numerous arrangements which, although not explicitly shown or described herein, embody those principles and are within its spirit and scope.

What is claimed is:

1. A digital interpolator for interpolating digital samples of a signal sampled at a first clock rate into a digital sample sampled at a second clock rate, said filter comprising, means for storing a plurality of coefficients each having a predetermined magnitude, said coefficients being the coefficients of a predetermined polynomial, means for receiving and storing a sequence of said digital samples samples at said first clock rate, means for combining individual ones of said sequence of digital samples with respective ones of said coefficients, means for determining the time difference between said first and second clock rates, and means for generating said interpolated digital sample as a function of each of said combination and the value of said time difference.

2. The digital interpolator set forth in claim 1 wherein said polynomial is an nth-degree polynomial.

3. The digital interloper set forth in claim 2 wherein said digital interpolator is a multitap delay line with each tap being associated with a respective tap coefficient whose value is a function of respective ones of said polynomial coefficients and said time difference.

4. A digital interpolator comprising
means for storing a plurality of coefficients of a predetermined polynomial, said coefficients having respective predetermined magnitudes,
means for receiving and storing a sequence of digital samples of a signal, said signal being sampled at a first clock rate,
means for determining the delay between said first clock rate and a second clock rate,
means for combining each of said digital samples with individual ones of said coefficients based on the order in which said samples are received, and
means for generating and outputting a digital signal representative of a sample of said signal sampled at said second clock rate as a function of each said combination and said delay.

5. The digital interpolator set forth in claim 4 wherein said polynomial is an nthdegree polynomial.

6. A method of interpolating digital samples of a signal sampled at a first clock rate into a digital sample sampled at a second clock rate comprising the steps of
storing a plurality of coefficients each having a predetermined magnitude, said coefficients being the coefficients of a nth-degree polynomial,
storing a sequence of said digital samples sampled at said first clock rate,
combining individual ones of said digital samples with respective ones of said coefficients,
determining the delay between said first and second clock rates, and
generating said interpolated digital sample as a function of each said combination and the value of said delay.

* * * * *

UNITED STATES PATENT AND TRADEMARK OFFICE
CERTIFICATE OF CORRECTION

PATENT NO. : 4,866,647

DATED : September 12, 1989

INVENTOR(S) : Cecil W. Farrow

It is certified that error appears in the above-identified patent and that said Letters Patent is hereby corrected as shown below:

Column 6, line 35, "exists" should read --exits--.
Column 6, line 60, "402" should read --403--.
Column 8, line 53, "samples" (second occurrence) should read --sampled--.

Signed and Sealed this

Second Day of July, 1991

Attest:

HARRY F. MANBECK, JR.

*Attesting Officer*  *Commissioner of Patents and Trademarks*